United States Patent [19]
Lin et al.

[11] B 3,990,060
[45] Nov. 2, 1976

[54] CRYPTOGRAPHIC MAGNETIC BUBBLE DOMAIN MEMORY

[75] Inventors: Yeong S. Lin, Mount Kisco; Chao N. Liu; Donald T. Tang, both of Yorktown Heights, all of N.Y.

[73] Assignee: International Business Machines Corporation, Armonk, N.Y.

[22] Filed: Mar. 27, 1974

[21] Appl. No.: 455,425

[44] Published under the second Trial Voluntary Protest Program on February 3, 1976 as document No. B 455,425.

[52] U.S. Cl. .................... 340/174 TF; 340/174 SR; 340/174 AC
[51] Int. Cl.² .................. G11C 11/14; G11C 19/08
[58] Field of Search ............... 340/174 TF, 174 SR, 340/174 AC

[56] References Cited
UNITED STATES PATENTS

| | | | |
|---|---|---|---|
| 3,508,225 | 4/1970 | Smith............................ | 340/174 TF |
| 3,613,058 | 10/1971 | Bonyhard et al.............. | 340/174 TF |
| 3,618,054 | 11/1971 | Bonyhard et al.............. | 340/174 TF |
| 3,701,125 | 10/1972 | Chang.......................... | 340/174 AC |
| 3,701,132 | 10/1972 | Bonyhard et al.............. | 340/174 TF |
| 3,737,882 | 6/1973 | Furuoya....................... | 340/174 TF |

*Primary Examiner*—Stanley M. Urynowicz, Jr.
*Attorney, Agent, or Firm*—Sughrue, Rothwell, Mion, Zinn & Macpeak

[57] ABSTRACT

The data stored in a coincident block access bubble domain memory with bit-organized chips is encrypted by skewing or permuting selected word bits by predetermined amounts. This is implemented by providing an additional current loop on some or all of the chips which overlies the major loop pattern and has nodes at the similar vector poles of the major loop. The proper energization of selected ones of these additional current loops, under the control of a security key, inhibits or suppresses the advance of the bubble domains in the corresponding major loops for a predetermined number of cycles of the in-plane propagating field, thus skewing the word bits in these chips with respect to the remaining word bits in the unsuppressed chips. Decryption is accomplished by further inhibiting the same major loops for the necessary number of cycles to restore word bit synchronization throughout the memory.

14 Claims, 2 Drawing Figures

CRYPTOGRAPHIC MAGNETIC BUBBLE DOMAIN MEMORY

BACKGROUND OF THE INVENTION

1. Field of the Invention

This invention relates to a method and apparatus for encrypting and decrypting data stored in a magnetic bubble domain memory by permuting or skewing selected word bits by predetermined amounts.

2. Description of the Prior Art

The recent and rapidly expanding development of magnetic bubble domain technology holds the promise of providing very fast, efficient, and low cost data memories in the near future. With the anticipated proliferation of such memory devices, the security of the data stored from unauthorized recovery thus becomes an important consideration.

The general proposition of developing a cipher by key permutations of clear data to implement a security function is known in the art. See, for example, the article by R. O. Skatrud in the Proceeding of the Fall Joint Computer Conference, 1969, at page 111. In view of the unique nature and characteristics of magnetic bubble domain memories, however, these known security techniques are not readily adaptable thereto and present special problems. It is a solution of these problems to which this invention is generally addressed.

SUMMARY OF THE INVENTION

A coincident block access bubble domain memory is provided comprising a plurality of bit-organized chips. Each chip has a major bubble domain circulation loop defined by a magnetically soft overlay pattern of permalloy or the like, and a plurality of minor loops that may be accessed through the major loop. Information, in the form of magnetic bubble domains, is written in, read out, and erased through the major loop, and transferred to a selected minor loop for recirculating storage. Each data word is written in parallel, with one bit going to each memory chip in the block. Thus, the number of chips defines the word length that may be accommodated in the memory block. All of the bit representing bubble domains of a given word are normally maintained in synchronism to keep the word intact. That is, they are all propagated throughout the chips together, transferred to and from the same minor loops at the same time, etc.

In accordance with this invention the memory content is encrypted by inhibiting the propagation or circulation of the bubble domains in the major loops of selected chips for a given number of cycles, or full rotations of the in-plane propagating field. The number of inhibition cycles or permutation steps may also vary between the selected chips, which would further enhance the strength or degree of encryption. The effect of this inhibition technique is to permute or skew the data bits for each word throughout the chip stack or storage levels, thereby resulting in an asynchronous storage mode whereby any unauthorized readout, without the necessary decryption, would be meaningless.

The encryption and decryption is implemented by providing a separate, additional current loop on some or all of the memory chips, the signals for which are controlled by a security key through appropriate select and timing logic. The additional current loop comprises a continuous strip of copper or the like which generally overlies (or underlies) the major loop pattern, and which has nodes at selected positions corresponding to the like vector poles of the major loop. By energizing this additional current loop at the appropriate time with a signal of the proper polarity, the movement or advance of the bubble domains in the major loop may be inhibited for a desired number of steps or cycles, thereby skewing the data bits represented by the presence or absence of such bubble domains with respect to the remaining bits of the same words in those chips whose additional current loops are not energized.

The security key is a binary vector of finite length containing two successive subfields. The length of the first subfield is equal to the number of additional current loops in the system, which is the same as the number of memory chips or word length if every chip has an additional current loop. This first subfield specifies the additional current loops that are to be energized during encryption and decryption. Thus, for example, if the memory block comprises eight chips and each one has an additional current loop, a first subfield of 01100010 would specify that the loops on chips two, three and seven are to be energized. The second subfield of the security key specifies the various combinations of cyclic permutations to be undergone by the selected chips. If all of the selected chips are to be suppressed or inhibited for the same number of cycles, then the second subfield is merely a binary number equal to the number of inhibition cycles. In this simple example, its length would be equal to the log to the base 2 of the number of bit positions in each major loop, thus enabling the second subfield to specify any number of inhibition cycles up to a full rotation of the major loop bits.

If the number of inhibition cycles in the selected major loops is different, then the second subfield becomes longer to accommodate the additional information. The choice depends on the compromise between system complexity and the power or strength of the encryption.

DETAILED DESCRIPTION OF A PREFERRED EMBODIMENT

Figure 1:
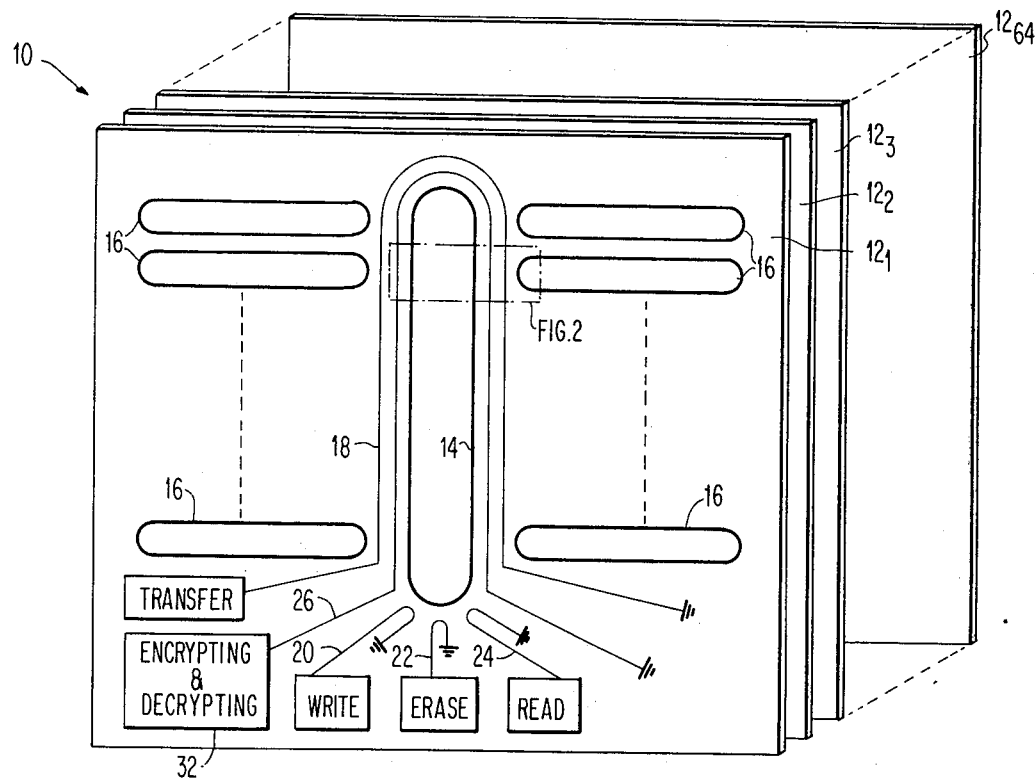
FIG. 1 shows a simplified schematic diagram of a coincident block access bubble domain memory with bit-organized chips (in this case is 64 chips), with each chip having an additional current loop in accordance with the teachings of this invention.

Referring to FIG. 1 reference numeral 10 generally designates a coincidence block access bubble domain memory comprising a plurality of bit-organized chips 12. In the embodiment shown there are 64 chips $12_1$, $12_2$, $12_3$ --- $12_{64}$, and thus a 64 bit word may be accommodated with 1 bit being stored in each chip.

Each chip is provided with a centrally disposed major loop 14, a plurality of minor loops 16, a transfer loop 18 to implement bubble domain transfer between the major and minor loops, a write loop 20, an erase loop 22, and a read loop 24. These various loop structures and their operation are well known in the art, form no part of the present invention, and hence will not be described in detail. Suffice to state that the bits of a given data word are conventionally written into the major loops 14 of the memory in parallel, and thereafter maintained in synchronism during their propagation throughout the memory, transfer to and from selected minor loops 16 for recirculating storage, etc.

Figure 2:
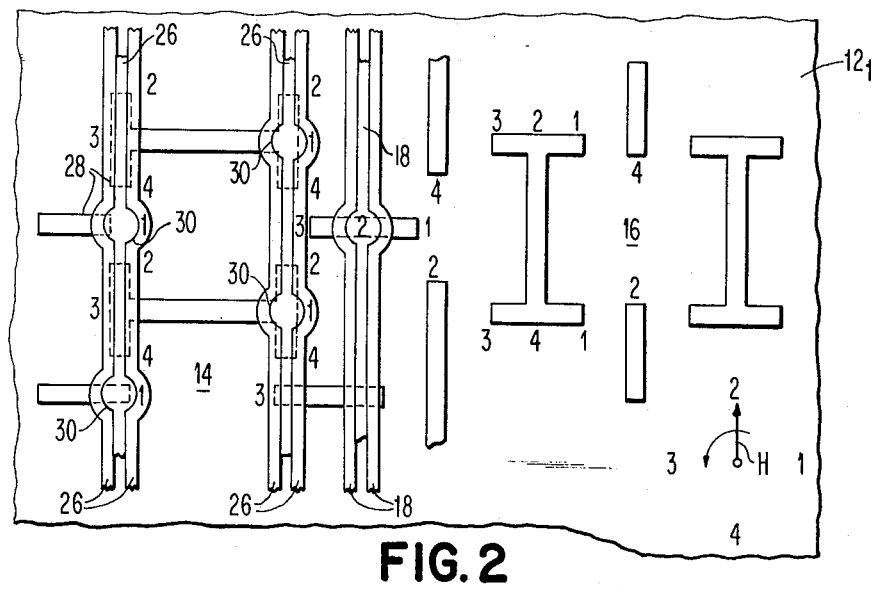
FIG. 2 shows an enlarged and more detailed view of the portion of FIG. 1 enclosed in chain line.

In accordance with the present invention an additional current loop 26 is provided to implement the encryption and decryption functions. As best seen in the enlarged view of FIG. 2, loop 26 overlies the T bar and I bar structures 28 of permalloy or the like that define the major loop 14, and has a plurality of enlarged nodes 30 at the similar vector poles 1. These vector poles are defined by the counterclockwise rotation of the in-plane propagating field vector H, shown in the lower right of FIG. 2, as is well known in the art.

In the absence of a pulse in the additional current loop 26, bubble domains move counterclockwise to recirculate in the major loop 14 (and the minor loops 16), passing consecutively through the pole positions 1, 2, 3, 4 during one cycle of the propagating field vector H. If, however, the loop 26 is energized by a signal of the proper polarity during the time that the field vector H passes through the 2 position, magnetic fields are developed at the nodes 30 which override the attractive force of the vector poles at the 2 positions and maintain all of the major loop bubble domains at the 1 positions until the signal is terminated. The necessary magnitude and duration of this inhibiting signal will depend on a number of parameters unique to a given memory system, such as the magnetic characteristics of memory chip or platelet material, the size of the bubble domains as determined by, inter alia, the strength of the supporting field, the strength of the field vector H, etc. The inhibiting signal may begin when the field vector H is approximately midway between the 1 and 2 positions and last until this vector is midway between the 2 and 3 positions, approximately 90° later. With this timing it will, of course, be necessary to generate a separate inhibiting signal for each suppression cycle. As an alternative, a continuous inhibiting signal may be generated, beginning and ending at the same relative vector positions but enduring throughout the intervening suppression cycles.

To illustrate the encrypting and decrypting operations, let it be assumed that there are 64 major loops 14 (or 64 chips) operating in parallel, as shown in FIG. 1, and that each major loop has a capacity of 256 bits. In normal operation, 256 bits would be loaded or written into each of the 64 major loops and synchronously distributed in corresponding bit positions of the minor loops 16 during one complete major loop cycle. During encryption, however, appropriate inhibition signals applied to selected ones of the additional current loops 26, as specified by the security key, suppress the bubble domain advance in the corresponding loops so that a cyclic permutation of the data bits occurs on those major loops. The data bits are then transferred into the appropriate minor loops after the second complete major loop cycle.

As a specific example, consider a block of input data wherein each bit b, represented by the presence or absence of an actual bubble domain, is depicted as follows:

| $b_{1,1}$  | $b_{1,2}$  | $b_{1,3}$  | $b_{1,256}$ |
|------------|------------|------------|-------------|
| $b_{2,1}$  | $b_{2,2}$  | $b_{2,3}$  | $b_{2,256}$ |
| .          | .          | .          | .           |
| .          | .          | .          | .           |
| $b_{64,1}$ | $b_{64,2}$ | $b_{64,3}$ | $b_{64,256}$. | where the first subscript indicates the bit position within a 64 bit word and the second subscript represents the word number or index. Thus, $b_{2,3}$ designates the second bit of word number three.

Suppose now that the security key specifies the subset of the first, third and fourth major loops to each have three shift positions suppressed. The security key, as described in the "Summary" section, would thus appear as follows:

first subfield of 64 bits      second subfield of 8 bits=$\log_2 256$
[101100————0]      [00000011].

After encryption, under the control of this security key, the block of data would then appear as follows:

| $b_{1,254}$ | $b_{1,255}$ | $b_{1,256}$ | $b_{1,1}$ | $b_{1,2}$ | $b_{1,253}$ |
|-------------|-------------|-------------|-----------|-----------|-------------|
| $b_{2,1}$   | $b_{2,2}$   | $b_{2,3}$   | $b_{2,4}$ | $b_{2,5}$ | $b_{2,256}$ |
| $b_{3,254}$ | $b_{3,255}$ | $b_{3,256}$ | $b_{3,1}$ | $b_{3,2}$ | $b_{3,253}$ |
| $b_{4,254}$ | $b_{4,255}$ | $b_{4,256}$ | $b_{4,1}$ | $b_{4,2}$ | $b_{4,253}$ |
| $b_{5,1}$   | $b_{5,2}$   | $b_{5,3}$   | $b_{5,4}$ | $b_{5,5}$ | $b_{5,256}$ |
| .           | .           | .           | .         | .         | .           |
| $b_{64,1}$  | $b_{64,2}$  | $b_{64,3}$  | $b_{64,4}$| $b_{64,5}$| $b_{64,256}$. |

As can easily be seen, the data at bit positions or rows one, three and four, corresponding to chips $12_1$, $12_3$, and $12_4$, has been shifted or skewed with respect to the other rows by three positions. It will also be noted that these permutations effect all of the bits in each suppressed row, thus skewing the entire memory content as viewed in each column.

With the memory content in this encrypted state, a readout by unauthorized parties would be meaningless and convey no useful information. Although the foregoing represents an intentionally simplified example, it is obvious that in normal practice the data advance would be inhibited in more than three data rows or memory levels, and the number of shift positions suppressed could be different for each row or row subset. If the number of shift positions to be suppressed in the selected major loops is different, then the length of the second subfield of the security key would increase, in the above example, to 8 x m where m is the number of shifts independently selected and $1 \leq m \leq 64$.

It should also be noted that the simplified encryption scheme presented above can include additional procedures to reinforce the power of encryption, such as pre-storing random data in a particular portion or portions of the memory block. The security key may also contain another control subfield which causes the addition of a random bit sequence to the entered data.

Decryption may be implemented, again under the control of the security key, by causing a further number of shift suppressions in the same selected major loops equal to, in the foregoing example, 256 minus the number specified by the second subfield of the key. This results in an inverse permutation which, in effect, erases the skewing and restores word bit synchronism throughout the memory. The decryption may be accomplished in a first major loop cycle and the resynchronized data may then be readout from the major loops during a second major loop cycle. While it thus requires two major loop cycles rather than the usual one to load and unload the minor loops, this is a small price to pay for the memory security provided thereby.

While the specific hardware interface between the security key and the additional current loops 26 controlled thereby has not been disclosed in detail as it forms no part of the present invention, such means may take any one of a number of forms well known by and obvious to those skilled in the art. The security key may, for example, be stored on a punched card, magnetic tape, or the like, may be readout in serial fashion, and loaded into a shift register. Once so loaded the outputs from the register stages corresponding to the first subfield could be coupled to enabling gates of the encrypting and decrypting logic blocks 32 which control the energization of the additional current loops 26 on each memory chip 12. The outputs from the register stages corresponding to the second subfield could, after decoding, also be supplied to the logic blocks 32 to thereby control the number of shift suppressions in the selected major loops.

Further, while the embodiment of FIG. 1 utilizes a major-minor loop organization, the principle is equally adaptable to other types of configurations, such as an on chip decoding of the type suggested in U.S. Pat. No. 3,689,902. Similarly, the field access configuration of permalloy T and I bars of FIG. 2 should be considered only exemplary, in that the concept may be extended to the use of other field access structures such as ion implanted gapless structures or the structures suggested in U.S. Pat. No. 3,516,077 or U.S. Pat. No. 3,460,116.

What is claimed is:

1. In a magnetic bubble domain memory including a plurality of data storage levels, means for entering plural bit data words into the memory in bit synchronism, with each word bit being represented by the presence or absence of a magnetic bubble domain, and means for moving the magnetic bubble domains within the data storage levels in cyclic steps along predetermined propagation paths, the improvement comprising means for encrypting the entered data words, comprising:
    means for inhibiting the shifting of the magnetic bubble domains in a nondestructive manner and in cyclic steps in selected storage levels for a predetermined number of cyclic steps, such that the bits in each word are skewed or permuted to thereby destroy the bit synchronism in each word yet maintaining the bit synchronism in each storage level.

2. A magnetic bubble domain memory as defined in claim 1 wherein the propagation paths on each data storage level include a major loop and a plurality of minor loops, each loop being defined by means for establishing magnetic poles in response to an applied rotating magnetic field.

3. The memory as set forth in claim 2 wherein said inhibiting means comprises an electrical conductor lying in close proximity to each major loop for establishing a plurality of magnetic poles at discrete positions and of sufficient strength to override the force of the magnetic poles established by the rotating magnetic field.

4. A magnetic bubble domain memory as defined in claim 3 wherein:
    a. the means for establishing overriding magnetic poles comprises a plurality of enlarged nodes on each electrical conductor, and
    b. said nodes are positioned at like magnetic pole positions of each major loop.

5. The memory of claim 4, wherein said magnetic bubble domains within said data storage levels are shifted simultaneously and synchronously.

6. The memory of claim 5, wherein said plural bit data words are entered in parallel into the memory.

7. In a magnetic bubble domain memory wherein plural data bit words are entered into the memory in bit synchronism on a plurality of data storage levels, with each word bit being represented by the presence or absence of a magnetic bubble domain, and wherein the magnetic bubble domains are moved within the data storage levels in cyclic steps along predetermined propagation paths, the improvement comprising a method of encrypting the entered data words, comprising:
    inhibiting the shifting of the magnetic bubble domain in a nondestructive manner and in cyclic steps in selected storage levels for a predetermined number of cyclic steps, such that the bits in each word are skewed or permuted to thereby destroy the bit synchronism in each word yet maintaining the bit synchronism in each storage level.

8. A method as defined in claim 7 wherein the number of cyclic steps of bubble domain inhibition differs between the selected storage levels.

9. A method as defined in claim 7 wherein the propagation paths on each data storage level include a major loop and a plurality of minor loops, each loop being defined by the establishment of magnetic poles in response to an applied rotating magnetic field.

10. A method as defined in claim 9 wherein the inhibition is accomplished by establishing a plurality of magnetic poles at discrete positions and of sufficient strength to override the force of the magnetic poles established by the rotating magnetic field.

11. A method as defined in claim 10 wherein the discrete positions are at like magnetic pole positions of each major loop.

12. A method as defined in claim 11 wherein the overriding magnetic poles are established no later than shortly after the time at which the rotating magnetic field is oriented in the direction of the like magnetic pole positions.

13. A method as defined in claim 11, wherein said magnetic bubble domains within said data storage levels are moved simultaneously and synchronously.

14. A method as defined in claim 13, wherein said plural bit data words are entered in parallel into the memory.

* * * * *